(12) United States Patent
Nakamura (10) Patent No.: US 6,566,770 B1
(45) Date of Patent: May 20, 2003

(54) SEMICONDUCTOR MANUFACTURING APPARATUS AND DEVICE MANUFACTURING METHOD

(75) Inventor: Gen Nakamura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 45 days.

(21) Appl. No.: 09/593,694

(22) Filed: Jun. 15, 2000

(30) Foreign Application Priority Data

Jun. 15, 1999 (JP) .......................................... 11-167960

(51) Int. Cl.⁷ .............................................. H01L 21/68
(52) U.S. Cl. ........................ 307/154; 307/119; 318/375
(58) Field of Search .................................. 307/112, 116, 307/119, 154; 318/375, 369, 362, 371, 762

(56) References Cited

U.S. PATENT DOCUMENTS

| | | | | |
|---|---|---|---|---|
| 3,598,934 A | * | 8/1971 | O'Connor, III | 200/16 C |
| 3,851,233 A | * | 11/1974 | Sherman | 318/375 |
| 3,897,595 A | * | 7/1975 | Fearno | 318/762 |
| 4,072,879 A | * | 2/1978 | Wadleigh | 318/369 |
| 4,284,175 A | * | 8/1981 | Ishii et al. | 187/289 |
| 4,305,030 A | * | 12/1981 | Lorenz | 318/371 |
| 4,843,501 A | * | 6/1989 | Okauchi et al. | 360/99.06 |
| 4,937,509 A | * | 6/1990 | Gundlach | 318/362 |
| 5,343,134 A | * | 8/1994 | Wendt et al. | 318/362 |
| 5,477,298 A | * | 12/1995 | Shiina et al. | 396/86 |
| 5,589,871 A | * | 12/1996 | Aoki et al. | 347/237 |
| 5,969,303 A | * | 10/1999 | Piserchia et al. | 318/375 |
| 6,094,023 A | * | 7/2000 | Ericsson | 318/362 |

FOREIGN PATENT DOCUMENTS

| | | | | |
|---|---|---|---|---|
| DE | 19722927 C1 | * | 12/1998 | H01H/47/00 |
| EP | 0795952 A2 | * | 9/1997 | H20P/3/24 |
| JP | 57-180381 | * | 11/1982 | H20P/3/12 |
| JP | 62208920 A | * | 9/1987 | B29C/45/84 |
| JP | 03-55095 | * | 3/1991 | D05B/69/26 |
| JP | 04008113 A | * | 1/1992 | H02H/03/06 |
| JP | 04-333623 | * | 11/1992 | D01H/1/24 |
| JP | 06-8187 | * | 1/1994 | B25J/19/06 |
| JP | 07328966 A | * | 12/1995 | B25J/09/10 |
| JP | 10125756 A | * | 5/1998 | H01L/21/68 |
| JP | 2001212778 A | * | 8/2001 | B25J/09/10 |
| JP | 2001-212778 | * | 8/2001 | B25J/9/10 |

* cited by examiner

Primary Examiner—Brian Sircus
Assistant Examiner—Roberto J. Rios
(74) Attorney, Agent, or Firm—Fitzpatrick, Cella, Harper & Scinto (57) ABSTRACT

A semiconductor manufacturing apparatus operable with supply of an electric power from a main electric power source wherein, in response to actuation of an emergency-off switch, the main electric power source is disconnected and, before the disconnection, braking control is made to a member being driven, by use of an electric power from the main electric power source.

15 Claims, 8 Drawing Sheets

SEMICONDUCTOR MANUFACTURING APPARATUS AND DEVICE MANUFACTURING METHOD

FIELD OF THE INVENTION AND RELATED ART

This invention relates generally to a semiconductor manufacturing apparatus and a device manufacturing method. More particularly, the invention concerns a safety switch, specifically, an emergency-off switch for performing an emergency-off (EMO) operation to an apparatus or a unit being operated.

In order to attain an increased production efficiency, the size of semiconductor manufacturing apparatuses as well as the size of manufacturing factories become larger. Also, for an increased operation rate of semiconductor manufacturing apparatuses, the operation time of the apparatuses becomes longer.

In these situations, the operation speed of the semiconductor manufacturing apparatuses is increasing and, therefore, a complicated safety function is required.

In order to comply with various safety standards or regulations, many apparatuses are equipped with an emergency-off (EMO) switch for disconnecting a main unit from an electric power source thereof.

Since the apparatuses become bulky and complicated, conventional disconnection methods for disconnecting a power input unit from an electric power source become insufficient. For example, where a stage having a large inertia is being driven at a high speed, if the supply of an electric power of a driving electric power source and of a control system is disconnected simultaneously through an emergency-off switch, the stage will continuously operate without being controlled by the control system, due to the inertial motion thereof. This causes a possibility of interference with any structural member or increases a danger for an operator or a service person.

More specifically, there are the following inconveniences.

(1) In a control process for a stage having a large inertia, mere disconnection of a driving electric power source results in that, due to the inertia, the stage continues its motion without being stopped. It is very dangerous to an operator or a service person.

(2) Regardless of the danger to the operator or service person, if the power of an electric power source and the power of a control unit for driving a predetermined member (such as a wafer stage, for example) having a large inertia, are disconnected simultaneously, the predetermined member becomes uncontrollable. Therefore, the possibility of breakage or disorder of the apparatus becomes very large. Also, the restoration for operation of the apparatus needs a long time.

Conventionally, an emergency-off switch is made to be operationally associated with a mechanical brake so as to stop the motion of the member being driven. With this method, however, if the member as braked and stopped has to be moved manually for maintenance thereof, for example, it can not be moved directly since the braking function still operates. Further, before completing the maintenance operation, the power source can not be turned on because there is a danger. Thus, the maintenance operation is quite complicated and cumbersome.

SUMMARY OF THE INVENTION

It is an object of the present invention to provide a semiconductor manufacturing apparatus or a semiconductor device manufacturing method, by which the facility of maintenance operation after an emergency stoppage is improved significantly and also by which the necessity of maintenance of a braking system is reduced significantly.

In accordance with an aspect of the present invention, there is provided a semiconductor manufacturing apparatus, comprising: a main unit operable with supply of an electric power from a main electric power source, said main unit including an electric driving system; an emergency-off switch; an interceptor for disconnecting the electric power from said main electric power source in response to actuation of said emergency-off switch; and a braking system for performing braking control of said electric driving system in response to the actuation of said emergency-off switch and prior to the interception of the electric power by said interceptor, wherein said braking system performs the braking control by use of an electric power supplied from said main electric power source.

In one preferred form of this aspect of the present invention, said braking system preferably controls at least one of a driving speed control and a position control for a member being driven by said electric driving system.

Said braking system may preferably electrically control a motor for driving the member, to stop the same.

Said braking system may preferably stop said electric driving system through mechanical braking.

Said emergency-off switch may include a first stage switch for actuating said braking system, a second stage switch for actuating said interceptor, and a button operationally associated with said first stage and second stage switches.

Said emergency-off switch may be operable so that, in response to depression of said button, said first stage switch operates to actuate said braking system and then said second stage switch operates to actuate said interceptor.

Said first stage switch may have a touch detection sensor, and said second stage switch may comprise a switch having a mechanical contact.

Said electric driving system may include a stage for moving a substrate for semiconductor device manufacture while carrying the same thereon.

In accordance with another aspect of the present invention, there is provided a semiconductor device manufacturing method, comprising the steps of: preparing a substrate for semiconductor device manufacture; performing a pattern printing exposure process to the substrate by use of an exposure apparatus which includes (i) a main unit operable with supply of an electric power from a main electric power source, the main unit including an electric driving system, (ii) an emergency-off switch, (iii) an interceptor for disconnecting the electric power from the main electric power source in response to actuation of the emergency-off switch, and (iv) a braking system for performing braking control of the electric driving system in response to the actuation of the emergency-off switch and prior to the interception of the electric power by the interceptor, wherein the braking system performs the braking control by use of an electric power supplied from the main electric power source; and developing the substrate after the pattern printing exposure process is made thereto, whereby a circuit pattern is produced on the substrate.

In accordance with a further aspect of the present invention, there is provided a semiconductor manufacturing apparatus, comprising a main unit operable with supply of an electric power from a main electric power source, said main unit including an electric driving system; an emergency-off switch; an interceptor for disconnecting the electric power from said main electric power source in response to actuation of said emergency-off switch; and a braking system for performing braking control of said electric driving system in response to the actuation of said emergency-off switch and prior to the interception of the electric power by said interceptor, wherein said braking system releases the braking control when the electric power from said main electric power source is disconnected by said interceptor.

In one preferred form of this aspect of the present invention, said braking system preferably electrically controls a motor for driving a member to be driven, to stop the same.

Said braking system may stop said electric driving system through mechanical braking.

Said emergency-off switch may include a first stage switch for actuating said braking system, a second stage switch for actuating said interceptor, and a button operationally associated with said first stage and second stage switches.

Said emergency-off switch may be operable so that, in response to depression of said button, said first stage switch operates to actuate said braking system and then said second stage switch operates to actuate said interceptor.

Said first stage switch may have a touch detection sensor, and said second stage switch may comprise a switch having a mechanical contact.

Said electric driving system may include a stage for moving a substrate for semiconductor device manufacture while carrying the same thereon.

In accordance with a yet further aspect of the present invention, there is provided a semiconductor device manufacturing method, comprising the steps of: preparing a substrate for semiconductor device manufacture; performing a pattern printing exposure process to the substrate by use of an exposure apparatus which includes (i) a main unit operable with supply of an electric power from a main electric power source, the main unit including an electric driving system, (ii) an emergency-off switch, (iii) an interceptor for disconnecting the electric power from the main electric power source in response to actuation of the emergency-off switch, and (iv) a braking system for performing braking control of the electric driving system in response to the actuation of the emergency-off switch and prior to the interception of the electric power by the interceptor, wherein said braking system releases the braking control when the electric power from said main electric power source is disconnected by said interceptor; and developing the substrate after the pattern printing exposure process is made thereto, whereby a circuit pattern is produced on the substrate.

DESCRIPTION OF THE PREFERRED EMBODIMENTS

DESCRIPTION OF THE PREFERRED EMBODIMENTS

Preferred embodiments of the present invention will now be described with reference to the accompanying drawings.

Embodiment 1

Figure 1:
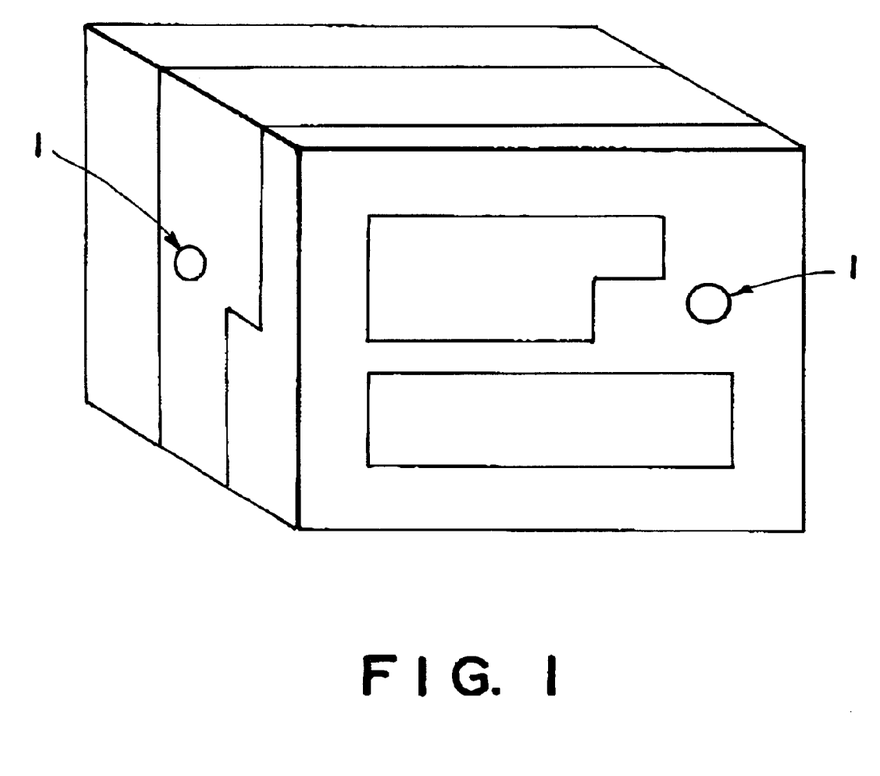
FIG. 1 is a perspective view, schematically illustrating the mounting position for placement of an emergency-off switch, in a semiconductor manufacturing apparatus according to a first embodiment of the present invention.

FIG. 1 is a perspective view of a semiconductor manufacturing apparatus according to a first embodiment of the present invention. Denoted at 1 in the drawing is an emergency-off switch. In this embodiment, the present invention is applied to a projection exposure apparatus as a semiconductor manufacturing apparatus. Since a basic structure of such projection exposure apparatus is well known in the art, details of it are not illustrated. Description therefor will also be omitted.

As shown in FIG. 1, an emergency-off switch 1 is provided at the front of the semiconductor manufacturing apparatus. Another emergency-off switch 1 is provided at a portion where a maintenance operation is to be done.

Figure 2:
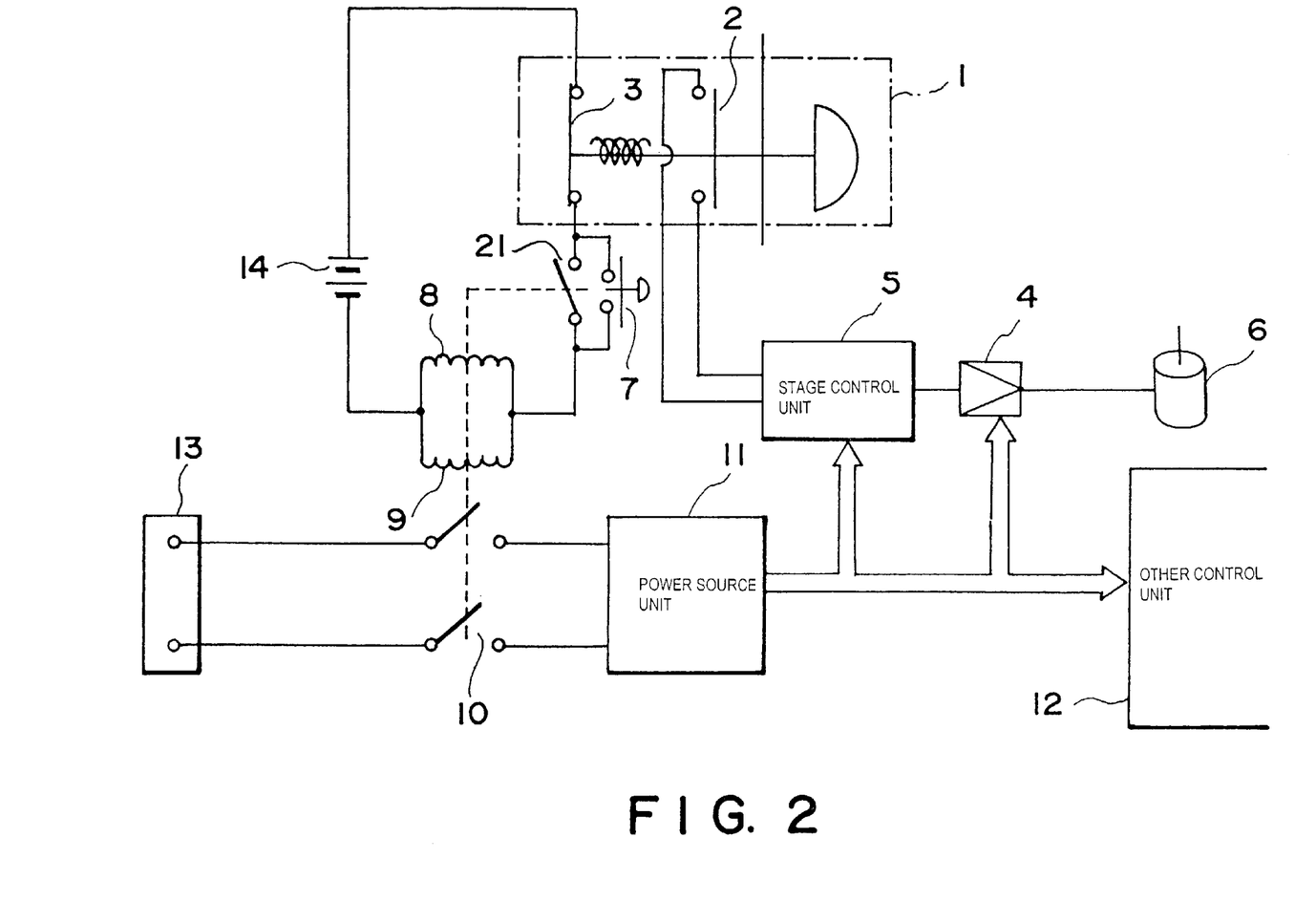
FIG. 2 is a block diagram for explaining connections in an emergency-off switch unit, in the semiconductor manufacturing apparatus of FIG. 1.

FIG. 2 illustrates inside connections of one emergency-off switch 1 provided in the semiconductor manufacturing apparatus of FIG. 1. As shown in FIG. 2, the emergency-off switch has a two-stage structure. More specifically, a first-stage contact 2 of the emergency-off switch 1 is connected to a control unit 5 for a stage motor 6 for moving a member to be driven.

A second-stage contact 3 of the emergency-off switch 1 is connected to an emergency interception control unit of an emergency-off switch control circuit, for providing ordinary emergency interception function. The control unit includes a power source unit 14 for controlling emergency interception, an electromagnetic relay 9 for controlling a power source on/off contact 10 for disconnection of the electric power of a power source unit 11 of the semiconductor manufacturing apparatus, a contact 21 for holding the emergency interception as the emergency-off switch is being actuated, a relay 8 for controlling the contact 21, and a reset switch 7 of momentarity type for resetting the emergency interception state.

As shown in FIG. 2, in the initial state of the semiconductor manufacturing apparatus, the emergency-off switch 1 is kept out of actuation. That is, the contact 2 which is connected to a stage control unit 5 of the emergency-off switch 1 is kept open, while the contact 3 for emergency interception operation is kept closed. In the semiconductor manufacturing apparatus in this state, the power source on/off contact 10 for disconnection of the electric power of each units 12, constituting the semiconductor manufacturing apparatus, is kept open, the contact 21 for holding the emergency interception of the emergency-off switch control circuit is kept open, and also the reset switch 7 for resetting the emergency interception state is kept open.

In order that an electric power is supplied to the semiconductor manufacturing apparatus in this state, first, the reset switch 7 for resetting the emergency interception state is depressed, to close the contact of the reset switch 7. As the contact of the reset switch 7 is closed, electric currents are applied from the electric power source unit 14 to the electromagnetic relay 9, for controlling the power source on/off contact 10, and to the relay 8 for holding the emergency interception state. In response, these contacts 10 and 21 are closed. As a result, an electric power for operating the apparatus is supplied from a factory equipment to the power source unit 11 through a connection terminal base 13.

In the power source unit 11 of the semiconductor manufacturing apparatus, an AC voltage of 200V is converted into a DC voltage of 24V and a DC voltage of 5V, and the thus converted voltages are applied to the stage control unit 5, a driving amplifier unit 4 for the stage motor 6, and any other control unit 12 of the semiconductor manufacturing apparatus. By this, the apparatus is placed in an operable state, such that a normal operation can be done.

The function of the emergency-off switch will now be described.

The emergency-off switch 1 of this embodiment has a two-stage structure. The switch 1 is arranged so that the stroke through which the first-stage contact 2, connected to the control unit 5 of the stage motor 6, moves from its open state to its closed state differs from the stroke through which the second-stage contact 3, connected to the emergency-off switch control unit, moves from its closed state to its open state.

Referring to FIGS. 2 and 3A–3C, the relationship of these contacts as well as the emergency interception function, as the emergency-off switch 1 is depressed, will be explained.

Figure 3A:
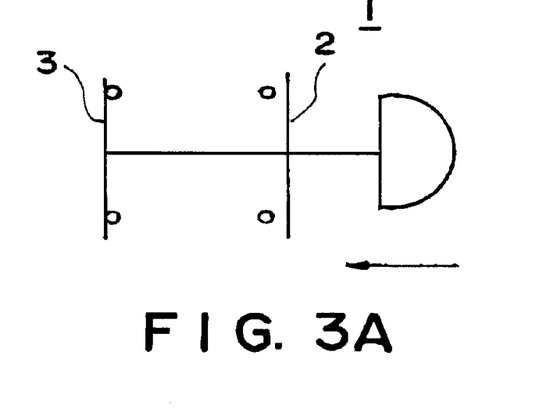
FIGS. 3A–3C are schematic views, respectively, for explaining the relation between strokes and contacts in the emergency-off switch of FIG. 2.
Figure 3B:
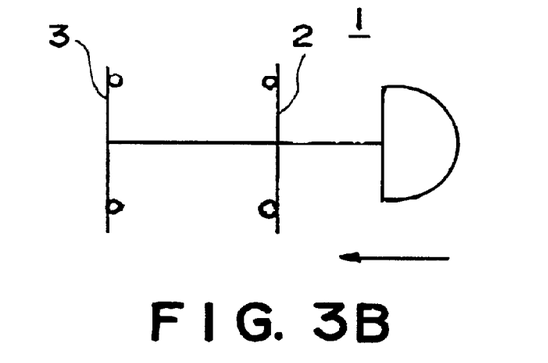
Figure 3C:
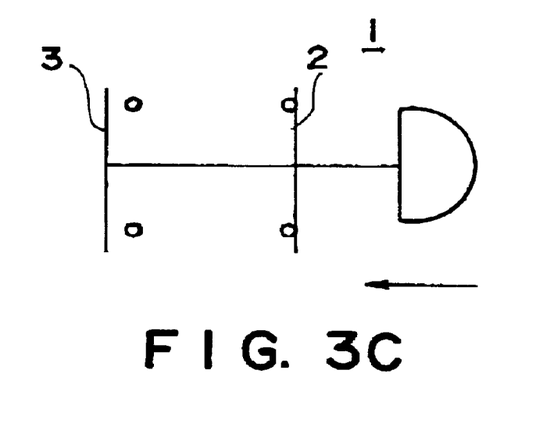

FIGS. 3A–3C illustrate the relationship of the contacts as well as the emergency-off switch strokes of the emergency-off switch of FIG. 2.

FIG. 3A shows a state in which, like the case of FIG. 2, the contact 2 is kept open while the contact 3 is kept closed.

When in the semiconductor manufacturing apparatus a member such as an X-Y stage for carrying a wafer thereon is being driven and if the emergency-off switch 1 is depressed, the switch 1 changes from the state shown in FIG. 3A to the state shown in FIG. 3B. In the state of FIG. 3B, the contact 2 connected to the control unit 5 of the motor 6 for moving the X-Y stage is closed, while on the other hand the contact 3 connected to the emergency-off switch control unit is also closed.

As the contact 2 connected to the control unit 5 is closed, inside the control unit 5, a zero-speed command signal is produced which signal is applied to the motor 6 through the amplifier unit 4, thereby to stop the motor 6. At this time, since the contact 3 connected to the emergency-off switch control unit is still kept closed, the supply of electric power to the whole apparatus is not disconnected. Thus, electric powers are supplied to the stage control unit 5 and the amplifier unit 4. Therefore, the stage control unit 5 can control the motor 6, to stop the member (e.g., the X-Y stage) effectively.

Further, as the emergency-off switch 1 is depressed, the switch 1 changes from the state shown in FIG. 3B to the state shown in FIG. 3C. In the state of FIG. 3C, the contact 2 is closed while the contact 3 is opened.

As the contact 3 of the emergency-off switch control circuit is made opened, the supply of electric powers to the electromagnetic relay 9 for controlling the contact 10 and to the relay 8 for controlling the contact 21 is disconnected. In response to it, the contacts 10 and 21 controlled by these relays 9 and 8 are opened. As the contact 10 is opened, the electric power supply to the apparatus power source unit 11 is disconnected, and the DC power source to be outputted from the power source unit 11 is disconnected. Thus, the supply of electric powers to the stage control unit 5, the amplifier unit 4 of the motor 6, and any other unit 12 of the apparatus is all disconnected.

Usually, when a member being driven is to be stopped, it will be stopped in about 100 milliseconds after a zero-speed command signal is outputted. Therefore, it will be sufficient that the emergency-off switch 1 has a strode, corresponding to a time lag of a few hundred milliseconds, for changing from the FIG. 3B state to the FIG. 3C state.

In the emergency interception operation, the contact 21 which is controlled by the relay 8 is opened, and the emergency-off switch 1 is returned to the FIG. 3A state by use of a resilient member, such as a spring, for example, attached to the switch 1. Thus, even if the contact 3 is made closed, no electric power is supplied to the electromagnetic relay 9 and to the relay 8. The contact 21 controlled by the relay 8 is therefore kept opened, and thus it holds the emergency interception state until the reset switch 7 is made closed.

The state described just above is the same as the initial state having been described hereinbefore. Therefore, where the semiconductor manufacturing apparatus is to be restored from this state, an operator depresses the reset switch 7 by which the operation is restored.

Embodiment 2

A second embodiment of the present invention will now be described with reference to FIG. 4.

The second embodiment differs from the first embodiment in that the emergency-off switch is provided by a combination of an electric element of touch detection type and a mechanical contact, rather than a mechanical two-stage contract structure.

In this embodiment, an emergency-off switch 17 comprises an electric contact 15 of touch detection type as well as a mechanical contact 16.

The electric contact 15 is connected to a control unit 5 for a motor 6 for moving a member to be driven. The mechanical contact 16 is connected to an emergency-off switch control unit, for the ordinary emergency interception function.

Figure 4:
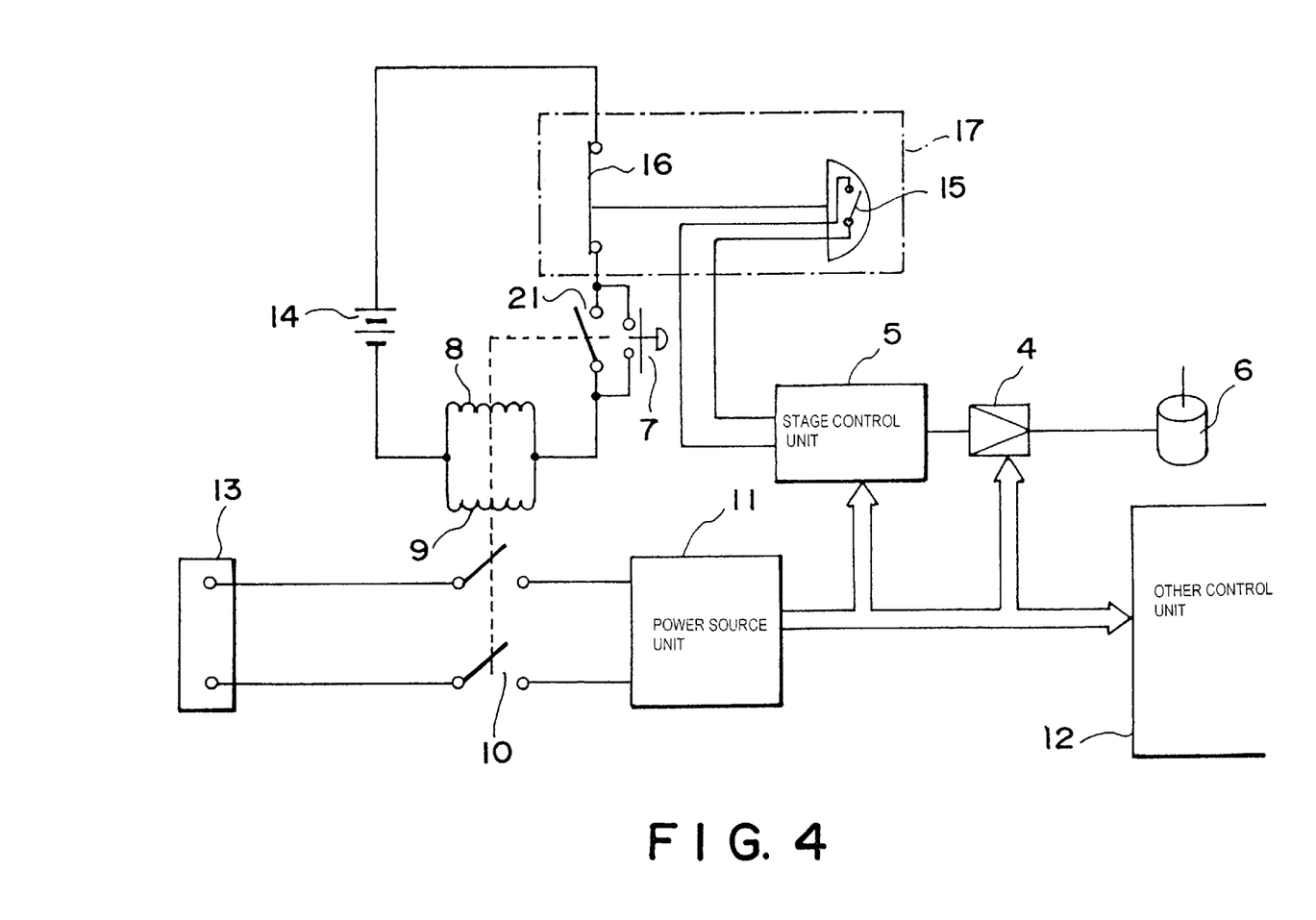
FIG. 4 is a block diagram for explaining connections in an emergency-off switch unit, in a semiconductor manufacturing apparatus according to a second embodiment of the present invention.

As shown in FIG. 4. in the initial state of the semiconductor manufacturing apparatus, the emergency-off switch 17 is kept out of actuation. That is, the contact 15 for controlling the motor 6 is kept open, while the mechanical contact 16 for emergency interception operation is kept closed. In the semiconductor manufacturing apparatus in this state, the power source on/off contact 10 for disconnection of the electric power of each units 12, constituting the semiconductor manufacturing apparatus, is kept open, the contact 21 for holding the emergency interception of the emergency-off switch control circuit is kept open, and also the reset switch 7 for resetting the emergency interception state is kept open.

In order that an electric power is supplied to the semiconductor manufacturing apparatus in this state, first, the reset switch 7 for resetting the emergency interception state is depressed, to close the contact of the reset switch 7. As the contact of the reset switch 7 is closed, electric currents are applied from the electric power source unit 14 to the electromagnetic relay 9, for controlling the power source on/off contact 10, and to the relay 8 for holding the emergency interception state. In response, these contacts 10 and 21 are closed. As a result, an electric power for operating the apparatus is supplied from a factory equipment to the power source unit 11 through a connection terminal base 13.

In the power source unit 11 of the semiconductor manufacturing apparatus, an AC voltage of 200V is converted into a DC voltage of 24V and a DC voltage of 5V, and the thus converted voltages are applied to the stage control unit 5, a driving amplifier unit 4 for the stage motor 6, and any other control unit 12 of the semiconductor manufacturing apparatus. By this, the apparatus is placed in an operable state, such that a normal operation can be done.

The function of the emergency-off switch will now be described.

The emergency-off switch 17 of this embodiment is provided by a combination of the electric touch detection type contact 15 and the mechanical contact 16. As an operator touches the emergency-off switch 17, the electric touch detection type contact 15 connected to the motor control unit 5 is changed from its open state to its closed state. As the emergency-off switch 17 is further depressed by an operator, the contact 16 connected to the emergency-off switch control circuit is changed from its closed state to its open state.

The relationship of these contacts as well as the emergency interception function, as the emergency-off switch 17 is depressed, will be explained in more detail.

When in the semiconductor manufacturing apparatus a member such as an X-Y stage for carrying a wafer thereon is being driven and if an operator touches the emergency-off switch 17 to depress the same, the electric tough detection type contact 15 connected to the motor control unit 5 is made closed and, also, the contact 16 connected to the emergency-off switch control unit is made closed.

As the electric tough detection type contact 15 is closed, inside the stage control unit 5, a zero-speed command signal is produced which signal is applied to the motor 6 through the amplifier unit 4, thereby to stop the motor 6. At this time, since the mechanical contact 16 connected to the emergency-off switch control unit is still kept closed, the supply of electric power to the whole apparatus is not disconnected. Thus, electric powers are supplied to the stage control unit 5 and the amplifier unit 4. Therefore, the stage control unit 5 can control the motor 6, to stop the member (e.g., the X-Y stage) effectively.

Further, as the emergency-off switch 17 is depressed, the electric touch detecting contact 15 is made closed while the mechanical contact 16 is opened.

As the mechanical contact 16 is opened, the emergency-off switch control circuit operates such that the supply of electric powers to the electromagnetic relay 9 for controlling the contact 10 and to the relay 8 for controlling the contact 21 is disconnected. In response to it, the contacts 10 and 21 controlled by these relays 9 and 8 are opened. As the contact 10 is opened, the electric power supply to the apparatus power source unit 11 is disconnected, and the DC power source to be outputted from the power source unit 11 is disconnected. Thus, the supply of electric powers to the stage control unit 5, the amplifier unit 4 of the motor 6, and any other unit 12 of the apparatus is all disconnected.

In the emergency interception operation, the contact 21 which is controlled by the relay 8 is opened, and the emergency-off switch 17 is returned. Thus, even if the mechanical contact 16 is made closed, no electric power is supplied to the electromagnetic relay 9 and to the relay 8. The contact 21 controlled by the relay 8 is therefore kept opened, and thus it holds the emergency interception state until the reset switch 7 is made closed.

The state described just above is the same as the initial state having been described hereinbefore. Therefore, where the semiconductor manufacturing apparatus is to be restored from this state, an operator depresses the reset switch 7 by which the operation is restored.

Embodiment 3

Figure 5:
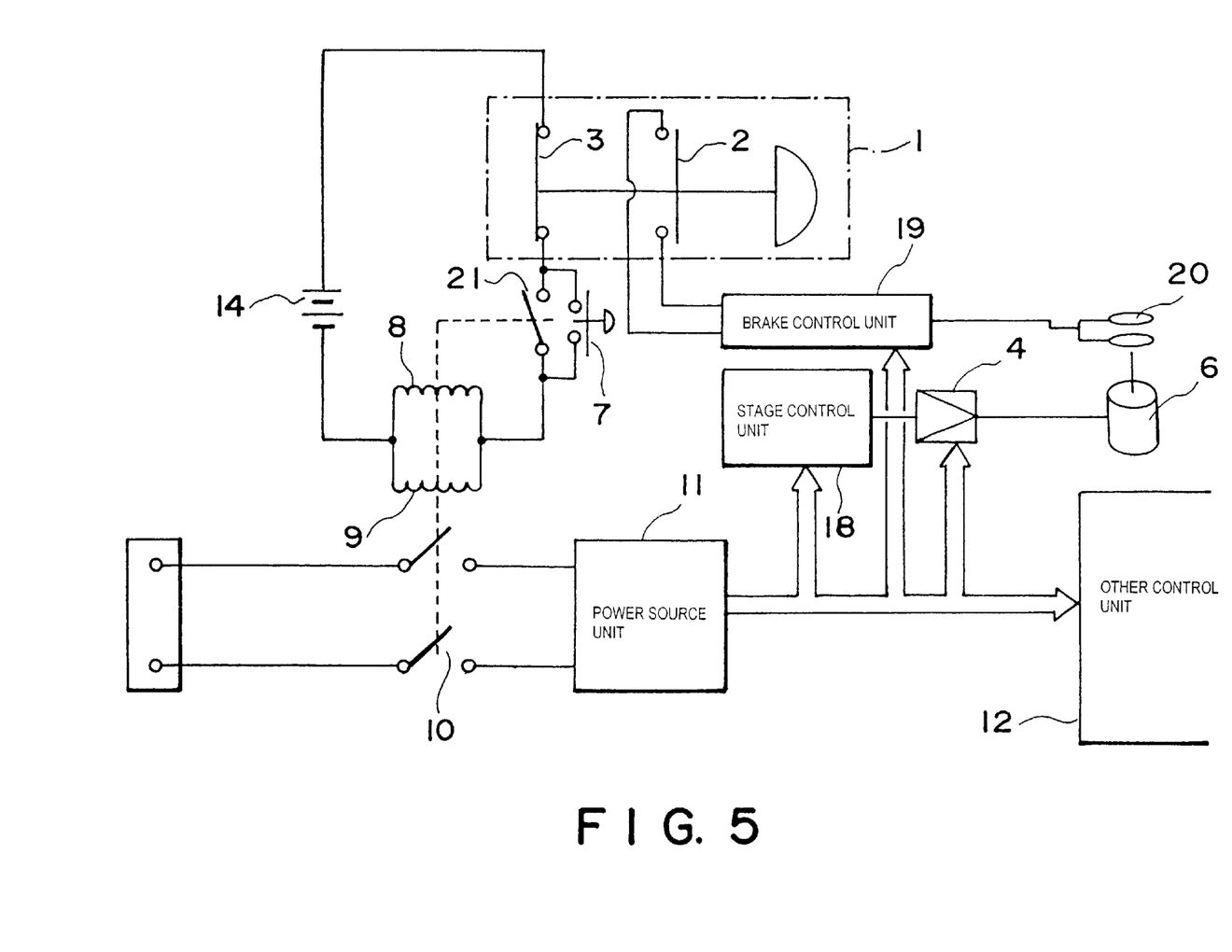
FIG. 5 is a block diagram for explaining connections in an emergency-off switch unit, in a semiconductor manufacturing apparatus according to a third embodiment of the present invention.

FIG. 5 is a block diagram for explaining the emergency interception function in a semiconductor manufacturing apparatus according to a third embodiment of the present invention.

The third embodiment differs from the first embodiment in the point of the method for stopping a stage, and the third embodiment uses a mechanical brake.

As shown in FIG. 5. the semiconductor manufacturing apparatus of this embodiment is equipped with an emergency-off switch 1 of two-stage structure. More specifically, a first-stage contact 2 of the emergency-off switch 1 is connected to a brake control unit 19 for controlling a brake 20 mounted coaxially with a shaft of a motor 6 for moving a member to be driven. The brake 20 has a structure that, only in response to application of an electric voltage thereto, a braking function operates and is held by use of a friction force. In FIG. 5, like numerals as those of FIG. 1 are assigned to corresponding elements.

As shown in FIG. 5, in the initial state of the semiconductor manufacturing apparatus, the emergency-off switch 1 is kept out of actuation. That is, the contact 2 of the emergency-off switch 1 for controlling the braking action is kept open, while the contact 3 for emergency interception operation is kept closed. Details of the emergency-off switch 1 are similar to those shown in FIGS. 3A–3C, and the state illustrated in FIG. 5 corresponds to the FIG. 3A state. In the semiconductor manufacturing apparatus in this state, the power source on/off contact 10 is kept open, the contact 21 for holding the emergency interception of the emergency-off switch control circuit is kept open, and also the reset switch 7 for resetting the emergency interception state is kept open.

In order that an electric power is supplied to the semiconductor manufacturing apparatus in this state, first, the reset switch 7 for resetting the emergency interception state is depressed, to close the contact of the reset switch 7. As the contact of the reset switch 7 is closed, electric currents are applied from the electric power source unit 14 to the electromagnetic relay 9, for controlling the power source on/off contact 10, and to the relay 8 for holding the emergency interception state. In response, these contacts 10 and 21 are closed. As a result, an electric power for operating the apparatus is supplied from a factory equipment to the power source unit 11 through a connection terminal base 13.

In the power source unit 11 of the semiconductor manufacturing apparatus, an AC voltage of 200V is converted into a DC voltage of 24V and a DC voltage of 5V, and the thus converted voltages are applied to the stage control unit 18, a driving amplifier unit 4 for the stage motor 6, and any other control unit 12 of the semiconductor manufacturing apparatus, as well as to the brake control unit 19. By this, the apparatus is placed in an operable state, such that a normal operation can be done.

The emergency-off switch 1 of this embodiment has a two-stage structure. The switch 1 is arranged so that the stroke through which the first-stage contact 2, connected to the control unit 19 of the brake 20, moves from its open state to its closed state differs from the stroke through which the second-stage contact 3, connected to the emergency-off switch control unit, moves from its closed state to its open state.

Referring to FIGS. 3A–3C and 5, the relationship of these contacts as well as the emergency interception function, as the emergency-off switch 1 is depressed, will be explained.

When in the semiconductor manufacturing apparatus a member such as an X-Y stage for carrying a wafer thereon is being driven and if the emergency-off switch 1 is depressed, the switch 1 changes from the state shown in FIG. 3A to the state shown in FIG. 3B. In the state of FIG. 3B, the contact 2 connected to the control unit 19 of brake 20 for the motor 6 for moving the X-Y stage is closed, while on the other hand the contact 3 connected to the emergency-off switch control unit is also closed.

As the contact 2 connected to the brake control unit 19 is closed, inside the brake control unit 19, an electric voltage for the brake 20 is produced, such that the stage motor 6 is braked. At this time, since the contact 3 connected of the emergency-off switch control unit is still kept closed, the supply of electric power to the whole apparatus is not disconnected. Thus, an electric power is supplied to the brake control unit 19. Therefore, the motor 6 can be effectively stopped by the brake 20.

Further, as the emergency-off switch 1 is depressed, the switch 1 changes from the state shown in FIG. 3B to the state shown in FIG. 3C. In the state of FIG. 3C, the contact 2 connected to the brake control unit 19 is closed while the contact 3 connected to the emergency-off switch control unit is opened.

As the contact 3 of the emergency-off switch control circuit is made opened, the emergency-off switch control circuit operates such that the supply of electric powers to the electromagnetic relay 9 for controlling the contact 10 and to the relay 8 for controlling the contact 21 is disconnected. In response to it, the contacts 10 and 21 controlled by these relays 9 and 8 are opened. As the contact 10 is opened, the electric power supply to the apparatus power source unit 11 is disconnected, and the DC power source to be outputted from the power source unit 11 is disconnected. Thus, the supply of electric powers to the stage control unit 5, the amplifier unit 4 of the motor 6, and any other unit 12 of the apparatus as well as to the brake control unit 19 is all disconnected. Simultaneously, the brake 20 is placed in a released state.

In the emergency interception operation, the contact 21 which is controlled by the relay 8 is opened, and the emergency-off switch 1 is returned. Thus, even if the contact 3 is made closed, no electric power is supplied to the electromagnetic relay 9 and to the relay 8. The contact 21 controlled by the relay 8 is therefore kept opened, and thus it holds the emergency interception state until the reset switch 7 is made closed.

The state described just above is the same as the initial state having been described hereinbefore. Therefore, where the semiconductor manufacturing apparatus is to be restored from this state, an operator depresses the reset switch 7 by which the operation is restored.

Embodiment 4

As regards the first to third embodiments described above, the structures of the first and third embodiments may be used at once in a semiconductor manufacturing apparatus. A fourth embodiment corresponds to this example.

In this embodiment, the emergency-off switch may be equipped with an additional contact which is operable simultaneously with the first-stage contact. Alternatively, a contact for stopping a member being moved may be connected to one of the stage control unit and the brake control unit, while the stage control unit and the brake control unit may be made operationally associated with each other. With these structures, the motor stopping operation and the braking operation can be done substantially simultaneously with each other, such that the stage can be stopped more precisely.

Embodiment 5

Figure 6A:
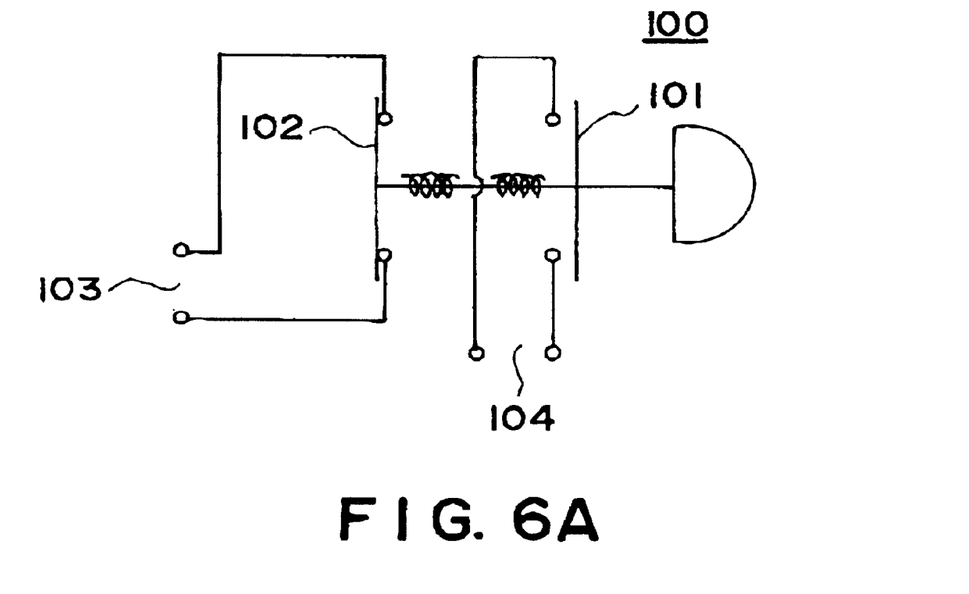
FIGS. 6A and 6B are schematic views, respectively, for explaining the relation between strokes and contacts in the emergency-off switch, in accordance with a fifth embodiment of the present invention.
Figure 6B:
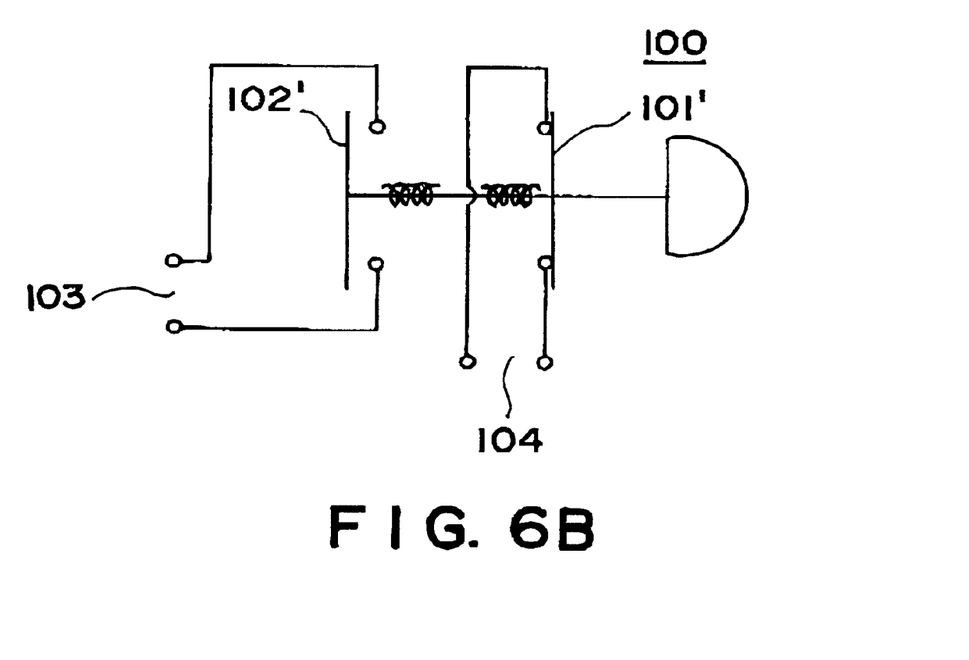

FIGS. 6A and 6B show a contact structure of an emergency-off switch according to a fifth embodiment of the present invention.

As shown in these drawings, this embodiment uses an emergency-off switch 100. In the first-stage operation of this switch 100, a contact 101 connected to a control unit of a motor for moving a member to be driven as well as a contact 102 connected to a emergency-off switch control unit, can operate substantially simultaneously. A connection end 104 of the contact 101 of the motor control unit and a connection end 103 of the contact 102 of the emergency-off switch control unit are connected to a motor control unit, a brake control unit or an emergency-off switch control unit of any one of the preceding embodiments.

If the stage movement speed is low, the stage will be stopped approximately at the same time as a zero-speed command signal for stopping the stage is outputted. Therefore, the system functions well even when the state of contacts shown at 101 and 102 in FIG. 6A changes to the state shown at 101' and 102' in FIG. 6B.

Embodiment of Semiconductor Device Manufacturing Method

Next, an embodiment of a semiconductor device manufacturing method which uses a semiconductor manufacturing apparatus according to any one of the preceding embodiments, will be explained.

Figure 7:
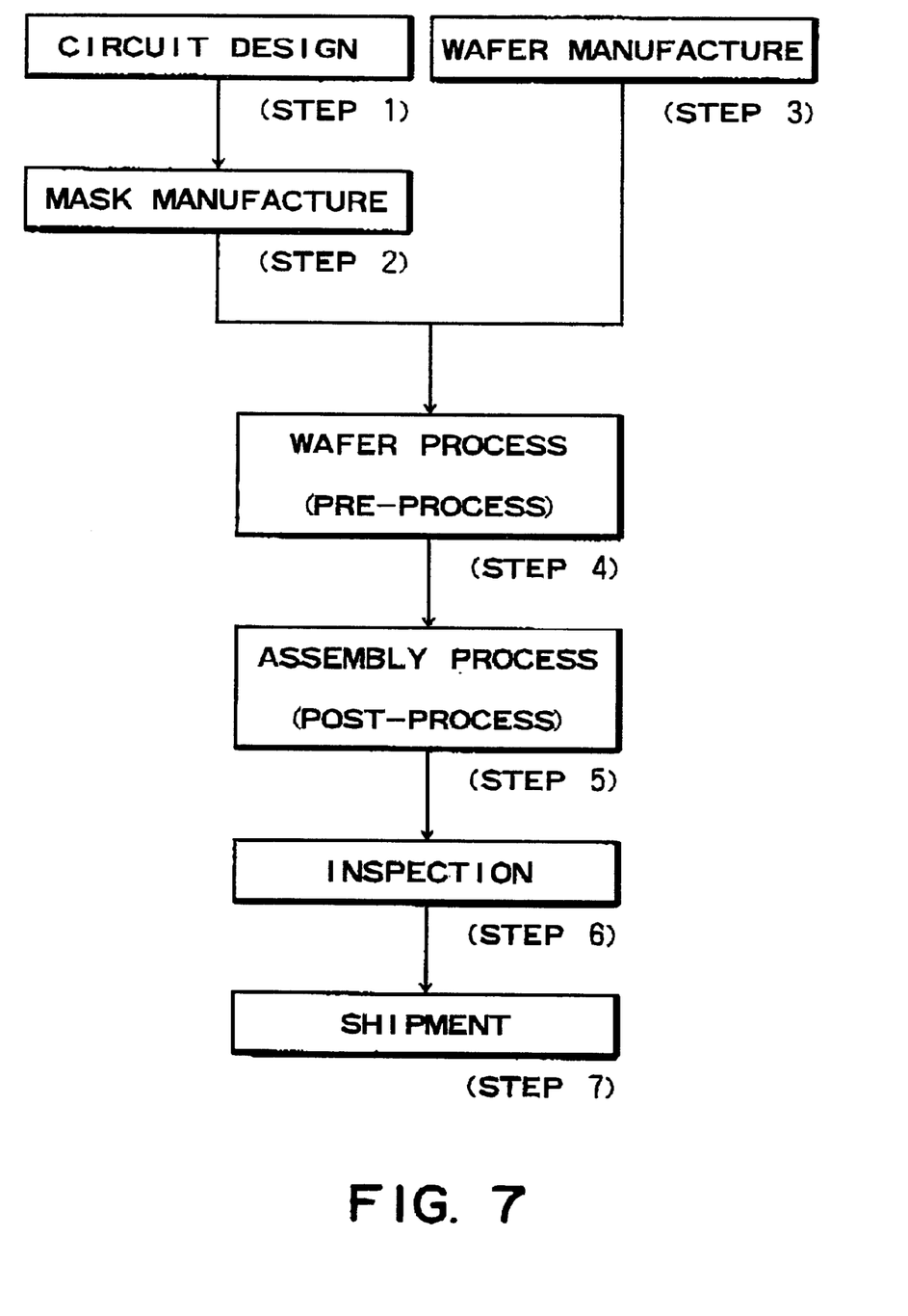
FIG. 7 is a flow chart of semiconductor device manufacturing processes.

FIG. 7 is a flow chart of procedure for manufacture of microdevices such as semiconductor chips (e.g. ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and water, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein operation check, durability check and so on for the semiconductor devices provided by step 5, are carried out. With these processes, semiconductor devices are completed and they are shipped (step 7).

Figure 8:
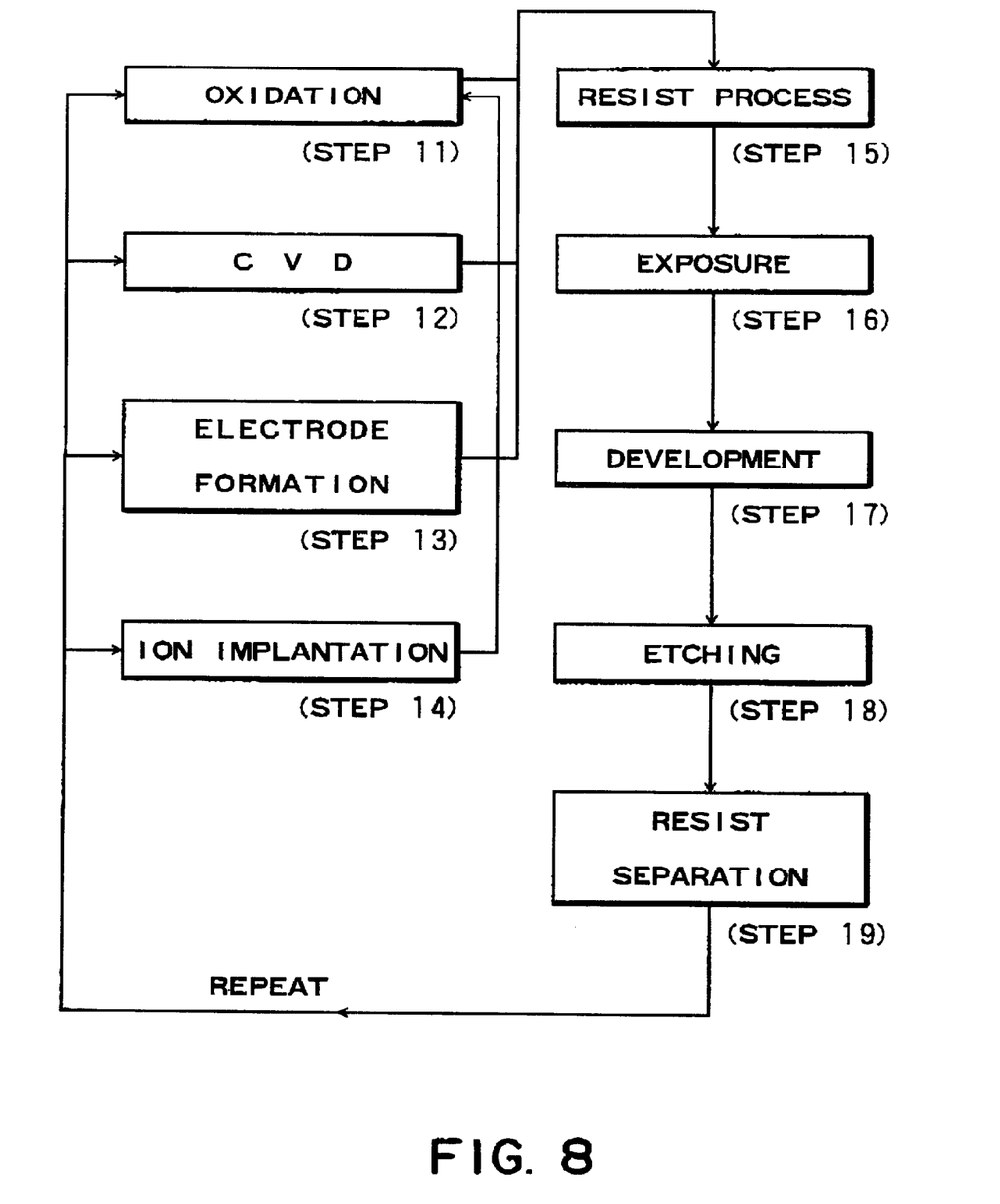
FIG. 8 is a flow chart for explaining details of a wafer process in the procedure of the flow chart of FIG. 7.

FIG. 8 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as has been described hereinbefore, the braking control can be performed prior to disconnection of an electric power and by use of a main electric power source. After the disconnection of the electric power, a maintenance operation can be made without the restriction by the braking function. The facility of maintenance operation is therefore improved significantly. Also, the need for maintenance of the braking means is reduced effectively.

While the invention has been described with reference to the structures disclosed herein, it is not confined to the details set forth and this application is intended to cover such modifications or changes as may come within the purposes of the improvements or the scope of the following claims.

What is claimed is:

1. A semiconductor manufacturing apparatus, comprising:
   a main unit operable with supply of an electric power from a main electric power source, said main unit including an electric driving system;
   an emergency-off switch;
   an interceptor, comprising electromechanical components, for disconnecting the electric power from said main electric power source in response to actuation of said emergency-off switch; and
   a braking system, comprising electromechanical components, for performing braking control of said electric driving system in response to the actuation of said emergency-off switch and prior to the interception of the electric power by said interceptor, wherein said braking system performs the braking control by use of an electric power supplied from said main electric power source;
   wherein said emergency-off switch includes a first stage switch for actuating said braking system, a second stage switch for actuating said interceptor, and a button mechanically and operationally associated with said first stage and second stage switches, and
   wherein a time lag exists between operation of the first stage switch and operation of the second stage switch.

2. An apparatus according to claim 1, wherein said braking system controls at least one of a driving speed control and a position control for a member being driven by said electric driving system.

3. An apparatus according to claim 2, wherein said braking system electrically controls a motor for driving the member, to stop the same.

4. An apparatus according to claim 1, wherein said braking system stops said electric driving system through mechanical braking.

5. An apparatus according to claim 1, wherein said emergency-off switch is operable so that, in response to depression of said button, said first stage switch operates to actuate said braking system and then said second stage switch operates to actuate said interceptor.

6. An apparatus according to claim 1, wherein said first stage switch has a touch detection sensor, and wherein said second stage switch comprises a switch having a mechanical contact.

7. An apparatus according to claim 1, wherein said electric driving system includes a stage for moving a substrate for semiconductor device manufacture while carrying the same thereon.

8. A semiconductor device manufacturing method, comprising the steps of:
   preparing a substrate for semiconductor device manufacture;
   performing a pattern printing exposure process to the substrate by use of an exposure apparatus which includes (i) a main unit operable with supply of an electric power from a main electric power source, the main unit including an electric driving system, (ii) an emergency-off switch, (iii) an interceptor, comprising electromechanical components, for disconnecting the electric power from the main electric power source in response to actuation of the emergency-off switch, and (iv) a braking system, comprising electromechanical components, for performing braking control of the electric driving system in response to the actuation of the emergency-off switch and prior to the disconnection of the electric power by the interceptor, wherein the braking system performs the braking control by use of an electric power supplied from the main electric power source; and
   developing the substrate after the pattern printing exposure process is made thereto, whereby a circuit pattern is produced on the substrate;
   wherein said emergency-off switch includes a first stage switch for actuating said braking system, a second stage switch for actuating said interceptor, and a button mechanically and operationally associated with said first stage and second stage switches, and
   wherein a time lag exists between operation of the first stage switch and operation of the second stage switch.

9. A semiconductor manufacturing apparatus, comprising
   a main unit operable with supply of an electric power from a main electric power source, said main unit including an electric driving system;
   an emergency-off switch;
   an interceptor, comprising electromechanical components, for disconnecting the electric power from said main electric power source in response to actuation of said emergency-off switch; and
   a braking system, comprising electromechanical components, for performing braking control of said electric driving system in response to the actuation of said emergency-off switch and prior to the disconnection of the electric power by said interceptor, wherein said braking system releases the braking control when the electric power from said main electric power source is disconnected by said interceptor;
   wherein said emergency-off switch includes a first stage switch for actuating said braking system, a second stage switch for actuating said interceptor, and a button mechanically and operationally associated with said first stage and second stage switches, and wherein a time lag exists between operation of the first stage switch and operation of the second stage switch.

10. An apparatus according to claim 9, wherein said braking system electrically controls a motor for driving a member to be driven, to stop the same.

11. An apparatus according to claim 9, wherein said braking system stops said electric driving system through mechanical braking.

12. An apparatus according to claim 9, wherein said emergency-off switch is operable so that, in response to depression of said button, said first stage switch operates to actuate said braking system and then said second stage switch operates to actuate said interceptor.

13. An apparatus according to claim 12, wherein said first stage switch has a touch detection sensor, and wherein said second stage switch comprises a switch having a mechanical contact.

14. An apparatus according to claim 9, wherein said electric driving system includes a stage for moving a substrate for semiconductor device manufacture while carrying the same thereon.

15. A semiconductor device manufacturing method, comprising the steps of:

preparing a substrate for semiconductor device manufacture;

performing a pattern printing exposure process to the substrate by use of an exposure apparatus which includes (i) a main unit operable with supply of an electric power from a main electric power source, the main unit including an electric driving system, (ii) an emergency-off switch, (iii) an interceptor, comprising electromechanical components, for disconnecting the electric power from the main electric power source in response to actuation of the emergency-off switch, and (iv) a braking system, comprising electromechanical components, for performing braking control of the electric driving system in response to the actuation of the emergency-off switch and prior to the disconnection of the electric power by the interceptor, wherein said braking system releases the braking control when the electric power from said main electric power source is disconnected by said interceptor; and developing the substrate after the pattern printing exposure process is made thereto, whereby a circuit pattern is produced on the substrate;

wherein said emergency-off switch includes a first stage switch for actuating said braking system, a second stage switch for actuating said interceptor, and a button mechanically and operationally associated with said first stage and second stage switches, and wherein a time lag exists between operation of the first stage switch and operation of the second stage switch.

* * * * *

UNITED STATES PATENT AND TRADEMARK OFFICE
CERTIFICATE OF CORRECTION

PATENT NO.     : 6,566,770 B1
DATED          : May 20, 2003
INVENTOR(S)    : Gen Nakamura It is certified that error appears in the above-identified patent and that said Letters Patent is hereby corrected as shown below:

Title page,
Item [56], FOREIGN PATENT DOCUMENTS,
"62208920 A" should read -- 62-208920 A --;
"04008113 A" should read -- 04-008113 A --;
"07328966 A" should read -- 07-328966 A --;
"10125756 A" should read -- 10-125756 A --; and
"2001212778 A" should read -- 2001-212778 A --.

Column 3,
Line 55, "DESCRIPTION OF THE PREFERRED" should read -- BRIEF DESCRIPTION OF THE --; and
Line 56, "EMBODIMENTS" should read -- DRAWINGS --.

Column 4,
Line 57, "momentarity" should read -- momentary --.

Column 6,
Line 2, "powers" should read -- power --;
Line 10, "powers" should read -- power --; and
Line 43, "contract" should read -- contact --.

Column 7,
Line 37, "tough" should read -- touch --;
Line 41, "tough" should read -- touch --;
Line 58, "powers" should read -- power --; and
Line 65, "powers" should read -- power --.

UNITED STATES PATENT AND TRADEMARK OFFICE
CERTIFICATE OF CORRECTION

PATENT NO. : 6,566,770 B1
DATED : May 20, 2003
INVENTOR(S) : Gen Nakamura

It is certified that error appears in the above-identified patent and that said Letters Patent is hereby corrected as shown below:

<u>Column 8,</u>
Line 67, "done." should read -- performed. --.

<u>Column 9,</u>
Line 38, "powers" should read -- power --; and
Line 46, "powers" should read -- power --.

Signed and Sealed this

Ninth Day of December, 2003

JAMES E. ROGAN
*Director of the United States Patent and Trademark Office*